United States Patent [19]
Gill

[11] Patent Number: 5,880,913
[45] Date of Patent: Mar. 9, 1999

[54] ANTIPARALLEL PINNED SPIN VALVE SENSOR WITH READ SIGNAL SYMMETRY

[75] Inventor: Hardayal Singh Gill, Portola Valley, Calif.

[73] Assignee: International Business Machines Corporation, Armonk, N.Y.

[21] Appl. No.: 957,850

[22] Filed: Oct. 27, 1997

[51] Int. Cl.$^6$ .................................................. G11B 5/39
[52] U.S. Cl. ............................................................ 360/113
[58] Field of Search ............................................. 360/113

[56] References Cited

U.S. PATENT DOCUMENTS

| | | | |
|---|---|---|---|
| 5,341,261 | 8/1994 | Dieny et al. | 360/113 |
| 5,408,377 | 4/1995 | Gurney et al. | 360/113 |
| 5,422,571 | 6/1995 | Gurney et al. | 324/252 |
| 5,508,867 | 4/1996 | Cain et al. | 360/113 |
| 5,585,986 | 12/1996 | Parkin | 360/113 |
| 5,648,885 | 7/1997 | Nishioka et al. | 360/113 |
| 5,701,222 | 12/1997 | Gill et al. | 360/113 |
| 5,793,207 | 8/1998 | Gill | 360/113 |

FOREIGN PATENT DOCUMENTS 0758783  2/1997  European Pat. Off. .......... G11B 5/39

OTHER PUBLICATIONS

Ultrathin Magnetic Structures II, "Measurement Techniques and Novel Magnetic Properties", Springer–Verlag, 1994 pp. 174–194.

*Primary Examiner*—John H. Wolff
*Attorney, Agent, or Firm*—Paik Saber

[57] ABSTRACT

An Anti-Parallel (AP)-pinned spin valve (SV) sensor having a free layer disposed between an AP-pinned layer and a pinned layer. The free layer being separated from the AP-pinned layer by a first conducting spacer and separated from the pinned layer by a second conducting spacer layer. The AP-pinned layer includes a first, second and third AP-pinned layers where the first and second AP-pinned layers are separated from the third AP-pinned layer by an anti-parallel coupling layer. The first AP-pinned layer is formed over and in contact with an antiferromagnetic (AFM) layer. The AFM layer is used to pin the AP-pinned layer magnetizations directions. The presence of both an AP-pinned layer and a pinned layer dramatically improves the symmetry of the signal read by the SV sensor; the presence of the second spacer layer made of GMR promoting material increases the GMR coefficient; and the addition of the first AP-pinned layer eliminates the interdiffusion at the interface between the AFM and the AP-pinned layer resulting in larger GMR coefficient, well controlled net moment, and a highly stable sensor.

47 Claims, 7 Drawing Sheets

ANTIPARALLEL PINNED SPIN VALVE SENSOR WITH READ SIGNAL SYMMETRY

BACKGROUND OF THE INVENTION

1. Field of the Invention

This invention relates generally to spin valve magnetic transducers for reading information signals from a magnetic medium and, in particular, to an improved antiparallel-pinned spin valve sensor, and to magnetic recording systems which incorporate such sensors.

2. Description of Related Art

Computer systems generally utilize auxiliary memory storage devices having media on which data can be written and from which data can be read for later use. A direct access storage device (disk drive) incorporating rotating magnetic disks is commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive read sensors, commonly referred to as MR heads, are the prevailing read sensors because of their capability to read data from a surface of a disk at greater linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization of the MR element and the direction of sense current flowing through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers.

GMR sensors using only two layers of ferromagnetic material separated by a layer of non-magnetic electrically conductive material are generally referred to as spin valve (SV) sensors manifesting the GMR effect (SV effect). In an SV sensor, one of the ferromagnetic layers, referred to as the pinned layer, has its magnetization typically pinned by exchange coupling with an antiferromagnetic (e.g., NiO or Fe—Mn) layer. The magnetization of the other ferromagnetic layer, referred to as the free layer, however, is not fixed and is free to rotate in response to the field from the recorded magnetic medium (the signal field). In SV sensors, the SV effect varies as the cosine of the angle between the magnetization of the pinned layer and the magnetization of the free layer. Recorded data can be read from a magnetic medium because the external magnetic field from the recorded magnetic medium causes a change in the direction of magnetization in the free layer, which in turn causes a change in resistance of the SV sensor and a corresponding change in the sensed current or voltage. It should be noted that the AMR effect is also present in the SV sensor free layer and it tends to reduce the overall GMR effect.

FIG. 1 shows a typical SV sensor 100 comprising end regions 104 and 106 separated by a central region 102. The central region 102 has defined edges and the end regions are contiguous with and abut the edges of the central region. A free layer (free ferromagnetic layer) 110 is separated from a pinned layer (pinned ferromagnetic layer) 120 by a non-magnetic, electrically-conducting spacer 115. The magnetization of the pinned layer 120 is fixed through exchange coupling with an antiferromagnetic (AFM) layer 121. Free layer 110, spacer 115, pinned layer 120 and the AFM layer 121 are all formed in the central region 102. Hard bias layers 130 and 135 formed in the end regions 104 and 106, respectively, provide longitudinal bias for the free layer 110. Leads 140 and 145 formed over hard bias layers 130 and 135, respectively, provide electrical connections for the flow of the sensing current $I_s$ from a current source 160 to the MR sensor 100. Sensing means 170 connected to leads 140 and 145 sense the change in the resistance due to changes induced in the free layer 110 by the external magnetic field (e.g., field generated by a data bit stored on a disk). IBM's U.S. Pat. No. 5,206,590 granted to Dieny et al. and incorporated herein by reference, discloses an MR sensor operating on the basis of the SV effect.

Another type of spin valve sensor currently under development is an antiparallel (AP)-pinned spin valve sensor. FIG. 2A show an AP-Pinned SV sensor 200 which was the subject of several experiments conducted by the inventor. SV sensor 200 has end regions 202 and 204 separated from each other by a central region 206. AP-pinned SV sensor 200 comprises a Ni-Fe free layer 225 separated from a laminated AP-pinned layer 210 by a copper spacer layer 220. The magnetization of the laminated AP-pinned layer 210 is fixed by an AFM layer 208 which is made of NiO. The laminated AP-pinned layer 210 includes a first ferromagnetic layer 212 (PF1) of cobalt and a second ferromagnetic layer 216 (PF2) of cobalt separated from each other by a ruthenium (Ru) antiparallel coupling layer 214. The AMF layer 208, AP-pinned layer 210, copper spacer 220, free layer 225 and a cap layer 230 are all formed sequentially in the central region 206. Hard bias layers 235 and 240, formed in end regions 202 and 204, provides longitudinal biasing for the free layer 225. Electrical leads 245 and 250 are also formed in end regions 202 and 204, respectively, to provide electrical current from a current source (not shown) to the SV sensor 200. As shown in FIG. 2B, the magnetization direction 265 (MF) of the free layer 225 is set to be parallel to the air bearing surface (ABS) in the absence of an external field. The magnetizations directions 255 ($M_{P1}$) and 260 ($M_{P2}$)of the pinned layers 212 and 214, respectively, are also set to be perpendicular to the ABS.

A key advantage of the AP-pinned SV sensor of FIG. 2 is the improvement of the exchange coupling field strength between the AFM layer 208 and AP-pinned layer 210. This improved exchange coupling increases the stability of the AP-pinned SV sensor 200 at high temperatures which allows the use of corrosion resistant antiferromagnetic materials such as NiO for the AFM layer 208.

However, there are two major issues associated with the AP-pinned SV sensor of FIG. 2A. First, experiments conducted on the SV sensor 200 have shown that the read signal asymmetry of the AP-pinned SV sensor 200 changes from near 0% to about 30% as the thickness of the free layer 225 was changed from 72 Å to 45 Å while the thickness of the other layers were left unchanged. Read signal asymmetry is defined by the relation $$\frac{V_1 - V_2}{\text{Max}(V_1, V_2)}$$

where $V_1$ is the maximum positive voltage of the read signal and $V_2$ is the maximum negative voltage of the read signal and $\max(V_1,V_2)$ means the maximum of either $V_1$ or $V_2$, whichever is larger. FIGS. 2C and 2D show the transfer curves for the read back voltage signal as a function of the applied fields for the SV sensor 200 with free layer thickness of 72 Å and 45 Å, respectively. Such a large read signal asymmetry implies that the optimum quiescent-state bias point does not lie near the middle of the resistance versus external field curve (FIG. 2D). The non-optimum bias point can cause sensor saturation, which results in non-linear response by the SV sensor. In-addition, the sensor saturation can also cause magnetic instability in the sensor. Due to these unfavorable effects, the error rate performance of the sensing means (for example, the recording channel) could be unacceptably degraded.

The reason for such a large signal asymmetry in the shape of the read signal sensed by the SV sensor 200 having a free layer thickness of 45 Å is due to the fact that the bias point of the AP-pinned SV sensor is determined by the balance of several forces ($H_{DemagAp}$, $H_{FC}$, $H_I$, and AMR) acting on the free layer 225 as shown in FIG. 2B. The demagnetization field ($H_{DemagAP}$) of the pinned layer 210 and the ferromagnetic coupling field ($H_{FC}$) between the free and pinned layers 225 and 210 is near zero. As a result, the bias point is mainly determined by the balance between the AMR effect present in the free layer 225 and the field generated by the current ($H_I$) flowing in the pinned layer 210 and the spacer layer 220. For a 72 Å thick free layer 225, the AMR coefficient is about 1% and the effect of the AMR on the bias point is nearly balanced by the $H_I$ field from the sense current flowing in the pinned layer and the spacer layer. However, for a 45 Å thick free layer 225, the AMR coefficient is only 0.5%. As a result, the effect of the AMR on the bias point is not balanced by the field $H_I$ from the sense current.

Second, the exchange coupling field between the AFM layer 208 and the AP-pinned layer 210 is inversely proportional to the magnetic moment difference (net magnetic moment) between the two AP-pinned ferromagnetic layers 212 and 216. However, it is very difficult to control the net moment of the AP-pinned layer 210 (Co/Ru/Co) because of interfacial diffusion that takes place at the interface between the NiO AFM layer 208 and the first pinned layer 212 of Co. This interaction between the NiO AFM layer 208 and the Co first pinned layer 212 creates magnetic dead layer at the NiO/Co interface. The interfacial diffusion that takes place at the aforementioned interface causes a change in the moment of the first pinned Co layer 212 even after the AP-pinned SV sensor of FIG. 2A has been completely built. The change in the moment of the first pinned layer 212 causes the change in the net moment of the AP-pinned layer 210 by factors of 2 to 3 from one wafer to another. Such large variations in the net moment of the AP-pinned layer 210 results in large variations in the pinning fields which compromises the stability of the SV sensor 200 as well as the symmetry and size of the signals detected (read) by the sensor.

Aside from the aforementioned major issues associated with the AP-pinned SV sensor 200, disk drive industry has been engaged in an ongoing effort to increase the GMR coefficient of the SV sensors in order to store more and more bits of information on any given disk surface.

Therefore, there is a need for an AP-pinned SV sensor where the symmetry of the read signal detected by the SV sensor (read signal symmetry) is substantially improved as well as having a large GMR coefficient.

SUMMARY OF THE INVENTION

It is an object of the present invention to disclose an AP-pinned SV sensor having an AP-pinned layer where the read signal symmetry is improved.

It is another object of the present invention to disclose an AP-pinned SV sensor having a large GMR coefficient.

It is a further object of the present invention to disclose an AP-pinned SV sensor having an AP-pinned layer where the net moment of the AP-pinned layer is well controlled.

It is another object of the present invention to disclose an AP-pinned SV sensor having an AP-pinned layer and an antiferromagnetic layer (AFM) where there is no interdiffussion at the interface between the AFM layer and the AP-pinned layer.

The foregoing objects and others are achieved in accordance with the principles of the present invention where there is disclosed an AP-pinned SV sensor having end regions separated from each other by a central region. The central region has defined edges and the end regions are contiguous with and abut the edges of the central region. The AP-pinned SV sensor includes a ferromagnetic free layer disposed between a first and a second spacer layer of non-magnetic electrically conducting material. The free layer may further comprise a plurality of sub-layers made of different ferromagnetic materials. The free layer is further separated from an AP-pinned layer by the first spacer layer and separated from a pinned ferromagnetic layer by the second spacer layer. The AP-pinned layer further comprises first, second and third AP-pinned layers of ferromagnetic materials where the first and second AP-pinned layers are separated from the third AP-pinned layers by a non-magnetic antiferommagnetic coupling layer. The third AP-pinned layer is in contact with the first spacer layer. An antiferromagnetic (AFM) layer is in contact with the first AP-pinned layer and provides the exchange coupling field necessary to pin the magnetization direction in the AP-pinned layer.

The free layer is preferably made of Ni—Fe or cobalt (Co). Alternatively, the free layer may be made of a plurality of layers made of Ni—Fe and Co. The pinned layer is preferably made of Ni—Fe, although it may also be made of cobalt or Ni—Fe/Co multi-layers. The first AP-pinned layer is preferably made of Ni—Fe and the second and third AP-pinned layers are preferably made of cobalt (Co). The first and second spacer layers are preferably made of GMR promoting materials such as copper (Cu), although they may also be made of silver (Ag) or gold (Ag). The anti-parallel coupling layer is preferably made of ruthenium, although it may also be made of iridium (Ir) or rhodium (Rh). The AFM layer is preferably made of NiO although it may also be made of NiMn.

The addition of the pinned layer and a second GMR promoting spacer layer has two-fold advantages. First, it improves the GMR coefficient because of additional scattering that takes places across the second GMR promoting spacer layer. This scattering is in addition to the scattering that takes place across the first spacer layer. Second, the current flowing in the pinned layer creates a demagnetization field ($H_{DemagP}$) that opposes the demagnetization field ($H_{DemagAP}$) created by the AP-pinned layer. Furthermore, the current flowing in the pinned layer and the second spacer creates a field $H_{IA}$ (IA refers to the current flowing in the layers that are above the free layer as seen from the ABS) that also partially opposes the field $H_{IB}$ (IB refers to the current flowing in the layers that are below the free layer as seen from the ABS) resulting in an improved read signal symmetry.

The addition of the first AP-pinned layer of Ni—Fe isolates the second AP-pinned layer of Co from the AFM layer which results in improving the pinning field and magnetic moment control of the laminated AP-pinned layer structure which in turns improves the read signal symmetry.

In an alternative embodiment of the present invention, the AP-pinned SV sensor has an AP-pinned layer and a pinned layer, a free layer disposed between the AP-pinned layer and the pinned layer, a first spacer layer disposed between the AP-pinned layer and the free layer and a second spacer disposed between the free layer and the pinned layer. The spacer layers are made of GMR promoting materials. The AP-pinned layer comprises a first and a second AP-pinned layer separated from each other by an anti-parallel coupling layer. An AFM layer which is in contact with the first AP-pinned layer pins the magnetization of the AP-pinned layer. In this alternative embodiment, the addition of the pinned layer and the second spacer layer also provides a two fold improvement. First, it improves the GMR coefficient because of additional scattering that takes places across the second spacer layer. Second, the current flowing in the pinned layer creates a demagnetization field ($H_{DemagP}$) that opposes the demagnetization field ($H_{DemagAP}$) created by the AP-pinned layer. Furthermore, the current flowing in the pinned layer and the second spacer creates a field $H_{IA}$ that also partially opposes the field $H_{IB}$ created by the current flowing in the AP-pinned layer and the first spacer layer resulting in an improved read signal symmetry.

In yet another alternative embodiment of the present invention, the AP-pinned SV sensor has an AP-pinned layer and a pinned layer, a free layer disposed between the AP-pinned layer and the pinned layer, a first spacer disposed between the AP-pinned layer and the free layer and a second spacer disposed between the free layer and the pinned layer. The first spacer layer is made of GMR promoting material while the second spacer layer is made of non-GMR promoting highly resistive material. The AP-pinned layer comprises a first and a second AP-pinned layer separated from each other by an anti-parallel coupling layer. An AFM layer which is in contact with the first AP-pinned layer pins the magnetization of the AP-pinned layer. In this alternative embodiment, the addition of the pinned layer provides the following benefit. The current flowing in the pinned layer creates a demagnetization field ($H_{DemagP}$) that opposes the demagnetization field ($H_{DemagAP}$) created by the AP-pinned layer. Furthermore, the current flowing in the pinned layer and the second spacer creates a field $H_{IA}$ that also partially opposes the field $H_{IB}$ created by the current flowing in the AP-pinned layer and the first spacer layer resulting in an improved read signal symmetry.

The above as well as additional objects, features, and advantages of the present invention will become apparent in the following detailed written description.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

DETAILED DESCRIPTION OF THE PREFERRED EMBODIMENT

The following description is the best embodiment presently contemplated for carrying out the present invention. This description is made for the purpose of illustrating the general principles of the present invention and is not meant to limit the inventive concepts claimed herein.

Figure 3:
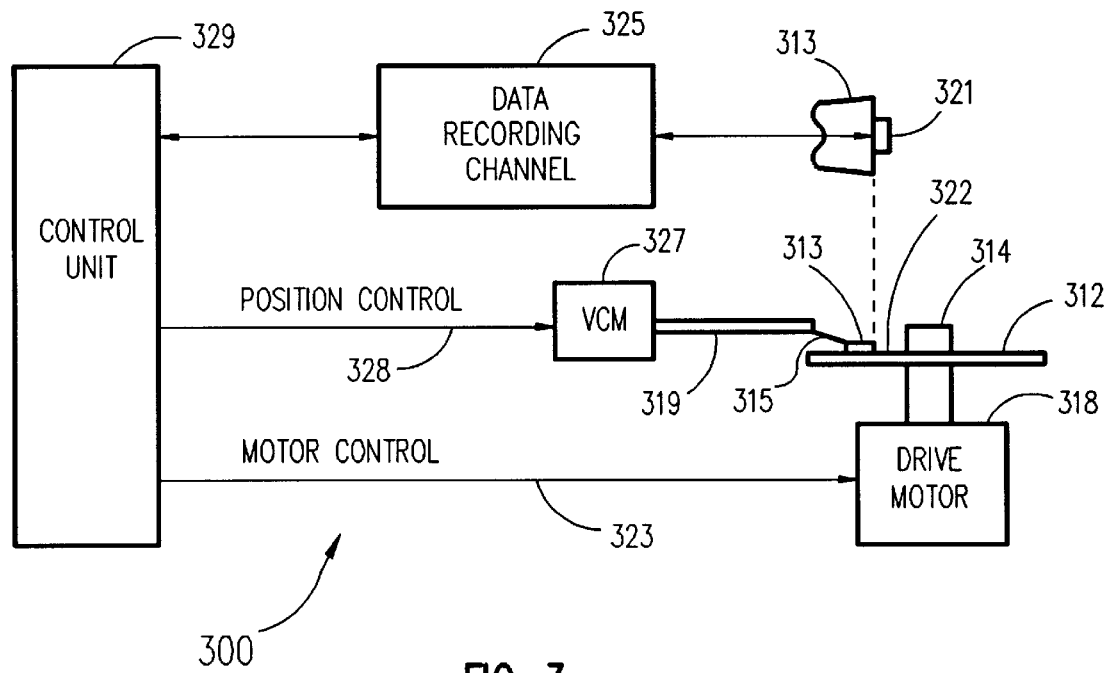
FIG. 3 is a simplified block diagram of a magnetic recording disk drive system.

Referring now to FIG. 3, there is shown a disk drive 300 embodying the present invention. As shown in FIG. 3, at least one rotatable magnetic disk 312 is supported on a spindle 314 and rotated by a disk drive motor 318. The magnetic recording media on each disk is in the form of an annular pattern of concentric data tracks (not shown) on disk 312.

At least one slider 313 is positioned on the disk 312, each slider 313 supporting one or more magnetic read/write heads 321 where the head 321 incorporates the MR sensor of the present invention. As the disks rotate, slider 313 is moved radially in and out over disk surface 322 so that heads 321 may access different portions of the disk where desired data is recorded. Each slider 313 is attached to an actuator arm 319 by means of a suspension 315. The suspension 315 provides a slight spring force which biases slider 313 against the disk surface 322. Each actuator arm 319 is attached to an actuator means 327. The actuator means as shown in FIG. 3 may be a voice coil motor (VCM). The VCM comprises a coil movable within a fixed magnetic field, the direction and speed of the coil movements being controlled by the motor current signals supplied by controller 329.

During operation of the disk storage system, the rotation of disk 312 generates an air bearing between slider 313 (the surface of slider 313 which includes head 321 and faces the surface of disk 312 is referred to as an air bearing surface (ABS)) and disk surface 322 which exerts an upward force or lift on the slider. The air bearing thus counter-balances the slight spring force of suspension 315 and supports slider 313 off and slightly above the disk surface by a small, substantially constant spacing during normal operation.

The various components of the disk storage system are controlled in operation by control signals generated by control unit 329, such as access control signals and internal clock signals. Typically, control unit 329 comprises logic control circuits, storage means and a microprocessor. The control unit 329 generates control signals to control various system operations such as drive motor control signals on line 323 and head position and seek control signals on line 328. The control signals on line 328 provide the desired current profiles to optimally move and position slider 313 to the desired data track on disk 312. Read and write signals are communicated to and from read/write heads 321 by means of recording channel 325.

The above description of a typical magnetic disk storage system, and the accompanying illustration of FIG. 3 are for representation purposes only. It should be apparent that disk storage systems may contain a large number of disks and actuators, and each actuator may support a number of sliders.

Figure 4C:
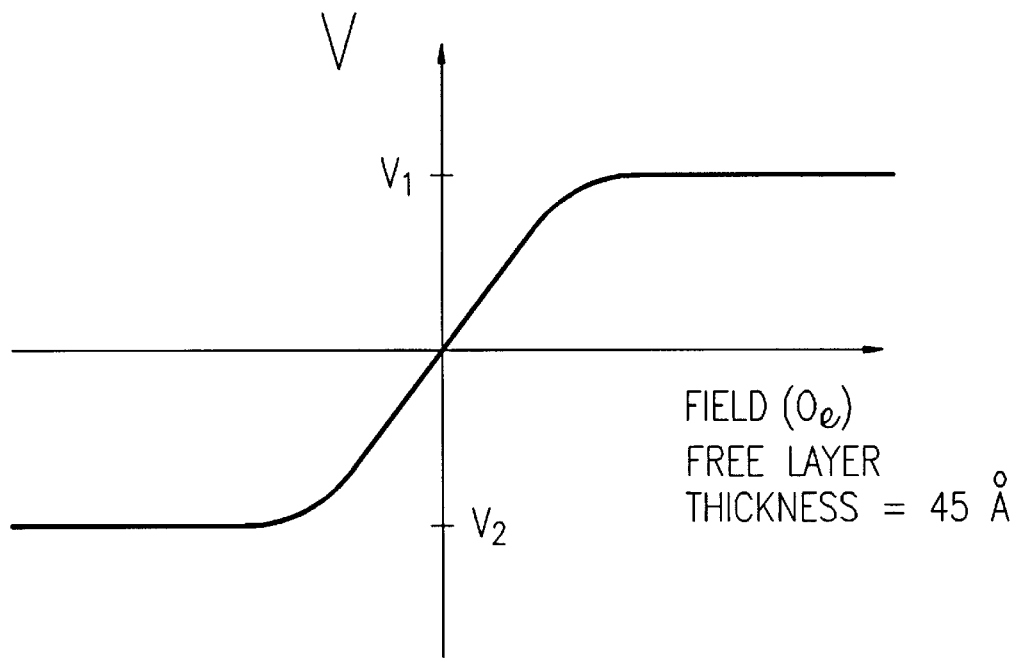
FIG. 4C is a transfer curve of the AP-pinned SV sensor of FIG. 4A having free layer thickness of 45 Å.
Figure 4A:
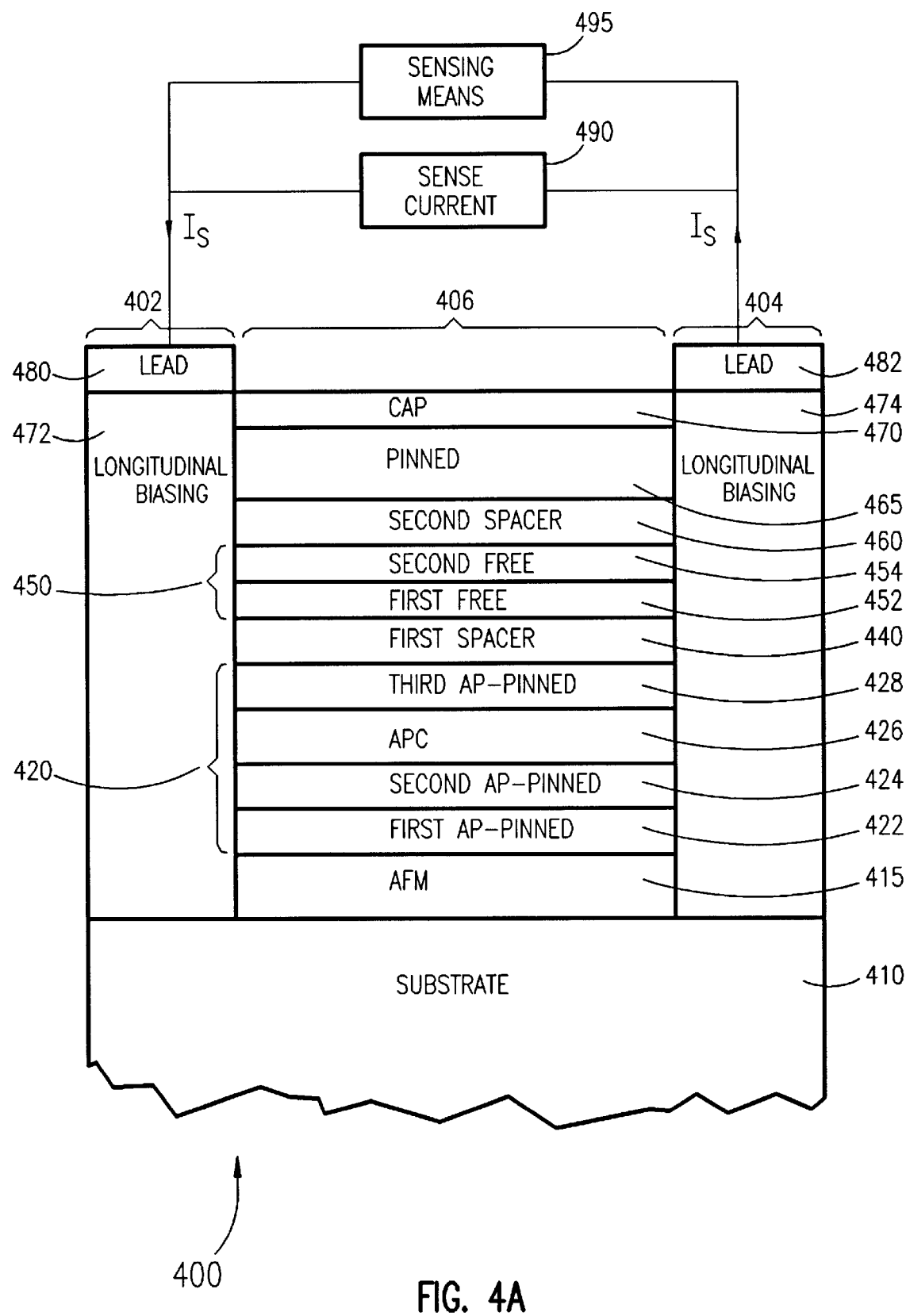
FIG. 4A is an air bearing surface view of the AP-pinned SV sensor of the present invention.

Now, with reference to FIG. 4A, there is shown an air bearing surface (ABS) view of the AP-pinned SV sensor 400 according to the preferred embodiment of the present invention. SV sensor 400 has end regions 402 and 404 separated from each other by a central region 406. Central region 406 has defined edges where the end regions 402 and 404 form a contiguous junction with and abut said edges. Substrate 410 can be any suitable substance, including glass, semiconductor material, or a ceramic material, such as alumina ($Al_2O_3$). Substrate 410 may also comprise a shield layer and a gap layer as is known to those skilled in the art. An antiferromagnetic (AFM) layer 415 is formed over the substrate 410 in the central region 406. Alternatively, the AFM layer 415 may be formed in both the central region 406 as well as the end regions 402 and 404. The AFM layer 415 is preferably made of NiO although it may also be made of other type of antiferromagnetic material such as NiMn. A laminated AP-pinned layer 420 is subsequently formed over the AFM layer 415. The AP-pinned layer 420 comprises first, second and third AP-pinned layers 422, 424 and 428, respectively. The first and second AP-pinned layers 422 and 424 are separated from the third AP-pinned layers 428 by an anti-parallel coupling layer 426 of nonmagnetic material that allows the first and second AP-pinned layers 422 and 424 to be strongly coupled to the third AP-pinned layers 428 antiferromagnetically. In the preferred embodiment, first AP-pinned layer 422 is a layer of Ni—Fe which is deposited on and in contact with the AFM layer 415. The anti-parallel coupling layer 426 is generally made of ruthenium (Ru) although it may also be made of iridium (Ir) or Rhodium (Rh). The second AP-pinned layer 424 which is formed over and in contact with the first AP-pinned layer 422 is generally made of cobalt. The third AP-pinned layer 428 which is formed over and in contact with the coupling layer 426 is also generally made of cobalt. SV sensor 400 also includes a first spacer layer 440 which is formed over and in contact with the third AP-pinned layer 428. The first spacer layer 440 is preferably made of GMR promoting material such as copper (Cu) although it may also be made of other GMR promoting materials such as gold (Au) or silver (Ag). A free ferromagnetic layer 450 is subsequently formed over and in contact with the spacer layer 440. In the preferred embodiment, free layer 450 is preferably made of first free layer 452 of cobalt deposited over and in contact with the spacer layer 440 and a second free layer 454 of Ni—Fe deposited over and in contact with the first free layer 452. Alternatively, free layer 450 may be made of a single layer of cobalt or a single layer of Ni—Fe material. Subsequent to the formation of the free layer 450, a second spacer layer 460 is formed over and in contact with the free layer 450. In the preferred embodiment of the present invention, the second spacer layer 460 is made of GMR promoting material such as copper. Alternatively, second spacer layer 460 may be made of high resistivity material such as tantalum (beta phase) which is not GMR promoting. SV sensor 400 further includes a pinned layer 465 which is formed over and in contact with the second spacer layer 460. The pinned layer 465 is generally made of Ni—Fe although it may also be made of Co or Ni—Fe/Co. A cap layer 470 is subsequently formed over the pinned layer 465 to protect the material deposited in the central region against oxidation. The cap layer is preferably made of tantalum (Ta). In the preferred embodiment of the present invention, AP-pinned layer 420, first and second spacer layers 440 and 460, free layer 450 and the pinned layer 465 are all formed only in the central region 406.

Referring again to FIG. 4A, SV sensor 400 further includes longitudinal biasing layers 472 and 474, formed in the end regions 402 and 404, respectively, for longitudinally biasing the free layer 450. Biasing layers 472 and 474 are preferably made of hard material such as CoPtCr.

Electrical leads 480, 482 are also formed over biasing layers 472 and 474, respectively to form a circuit path between the SV sensor 400 and a current source 490 and a sensing means 495. In the preferred embodiment, a magnetic signal in the medium is sensed by the sensing means 495 detecting the change in resistance, deltaR, as the magnetization direction $M_F$ of the free layer 450 rotates in response to the applied magnetic signal from the recorded medium. The sensing means may include a digital recording channel such as a partial-response maximum likelihood (PRML) channel as is known to those skilled in the art. Alternatively, it may include a peak-detect channel as is known to those skilled in the art. In the preferred embodiment of the present invention, the sensing means included a digital recording channel of the type known in the art as partial-response maximum-likelihood.

Referring again to FIGS. 4A and 4B, first and second AP-pinned layers 422 and 424 in the laminated AP-pinned layer 420 have their magnetizations directions $M_{AP1}$ and $M_{AP2}$ oriented generally perpendicular to the ABS and antiparallel with respect to the third pinned layer 428 magnetization direction $M_{AP3}$. The antiparallel alignment of the magnetizations directions $M_{AP1}$ and $M_{AP2}$ of the first and second AP-pinned layers 422 and 424 with respect to the magnetization direction $M_{AP3}$ of the third AP-pinned layer 428 is due to an antiferromagnetic exchange coupling through the anti-parallel coupling layer 426.

In the absence of an applied field, the free layer 450 has its magnetization direction $M_F$ generally perpendicular to the magnetizations directions $M_{AP1}$, $M_{AP2}$, and $M_{AP3}$ of the first, second and third AP-pinned layers 422, 424, and 428 and generally parallel with the ABS. Pinned layer 465 also has a magnetization direction $M_P$ which is toward the ABS and in parallel with magnetization direction $M_{AP3}$.

Referring again to FIG. 4B, in the AP-pinned SV sensor 400, there are five magnetic fields that influence the free layer 450 magnetization as summarized in TABLE I.

TABLE I

| Field | Field Description |
|---|---|
| $H_{IB}$ | Field generated by the current flowing in the layers below the free layer 450 as seen from the ABS; |
| $H_{FC}$ | Field generated as a result of ferromagnetic coupling between the free layer 450 and second and third AP-pinned layers 424 and 428; |
| $H_{DemagAP}$ | Field generated due to the demagnetization of the AP-pinned layer 420; |

TABLE I-continued

| Field | Field Description |
|---|---|
| $H_{IA}$ | Field genrated by the flow of the current in the layers above the free layer 450 as seen from the ABS; and |
| $H_{DemagP}$ | Field generated due to the demagnetization of the pinned layer 465. |

Figure 4B:
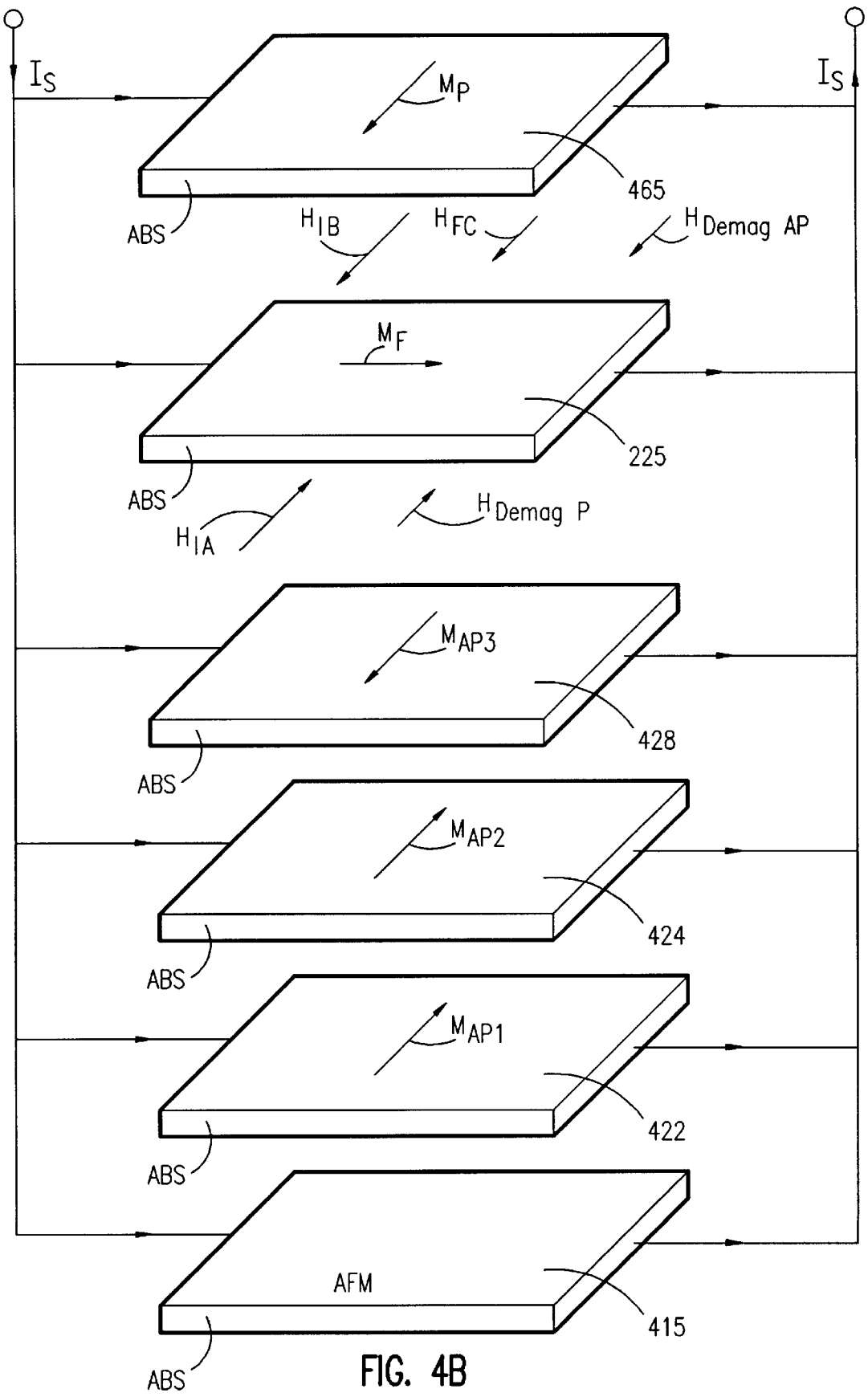
FIG. 4B is a perspective view of the free layer, pinned layer and the AP-pinned layer of the AP-pinned SV sensor of FIG. 4A.

As shown on FIG. 4B, the addition of the pinned layer 465 results in the generation of two new fields, $H_{IA}$ and $H_{DemagP}$, with their influence on the free layer 450 being opposite to the influence of $H_{IB}$ and $H_{DemagAP}$ fields. By appropriate selection of the pinned layer 465 thickness the magnitude of the $H_{IA}$ field and its counterbalancing effect on the $H_{IB}$ field can be controlled. In the preferred embodiment of the present invention, the thicknesses of the layers forming the central region of the AP-pinned SV sensor 400 were chosen as summarized in TABLE II.

TABLE II

AP-PINNED SENSOR 400

| Layer | Material | Thickness |
|---|---|---|
| 415 (AFM) | NiO | 400A |
| 422 (first AP-pinned) | NiFe | 10A |
| 424 (second AP-pinned) | Co | 24A |
| 426 (APC) | Ru | 6A |
| 428 (third AP-pinned) | Co | 24A |
| 440 (first spacer) | Cu | 22A |
| 452 (first free) | Co | 5A |
| 454 (second free) | Ni-Fe | 45A |
| 460 (second spacer) | Cu | 22A |
| 465 (pinned) | Ni-Fe | 10A |
| 470 (Cap) | Ta | 30A |

Figure 1:
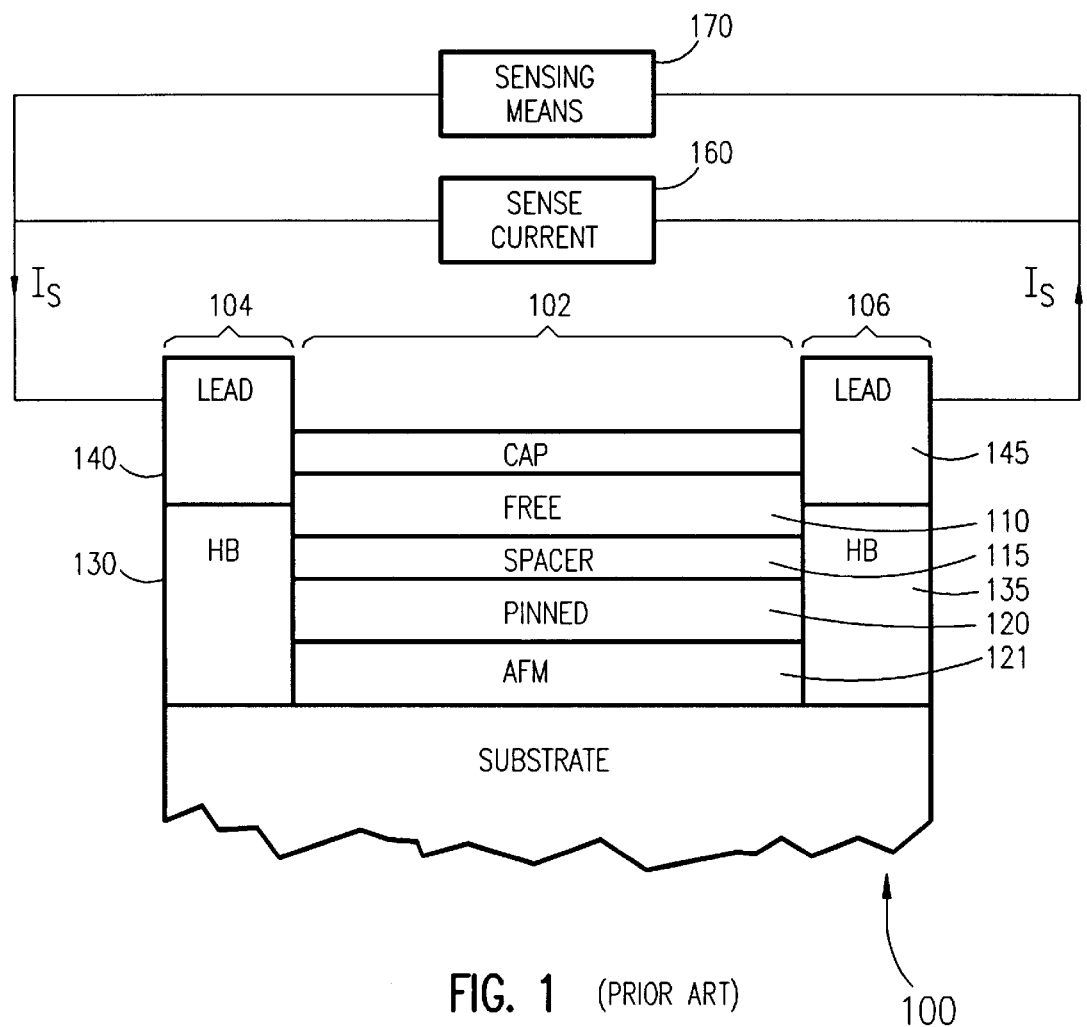
FIG. 1 is a sectional view of a prior art SV sensor.
Figure 2A:
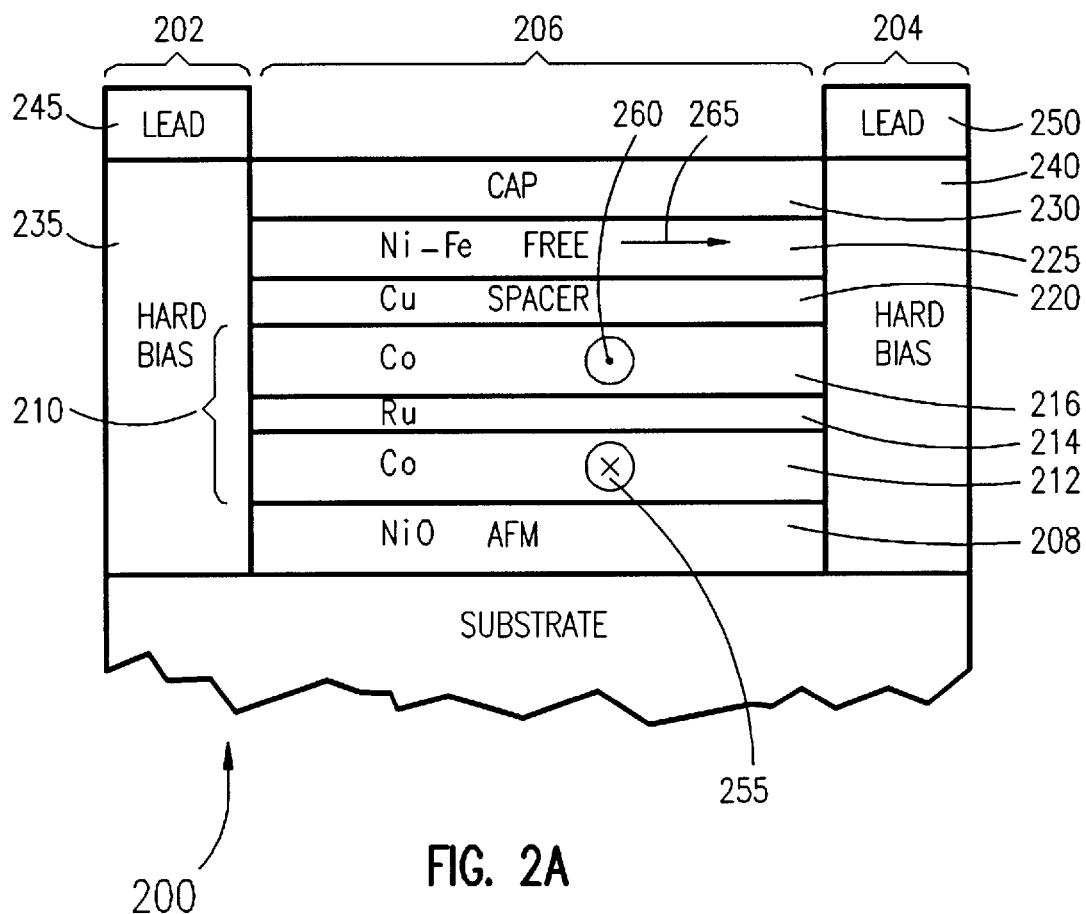
FIG. 2A is an air bearing surface view of an AP-pinned SV sensor.
Figure 2B:
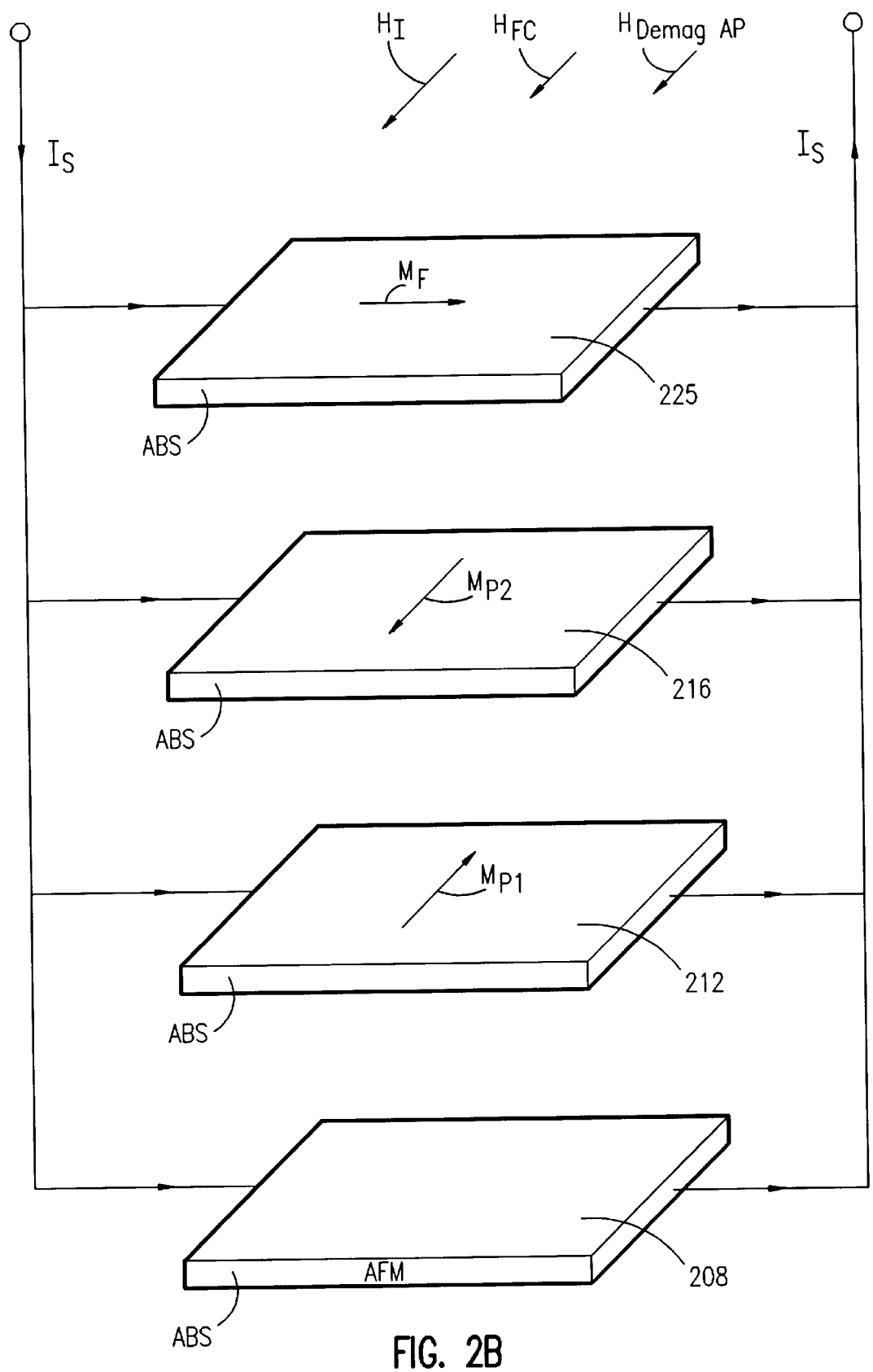
FIG. 2B is a perspective view of selected layers of the AP-pinned SV sensor of FIG. 2A.
Figure 2C:
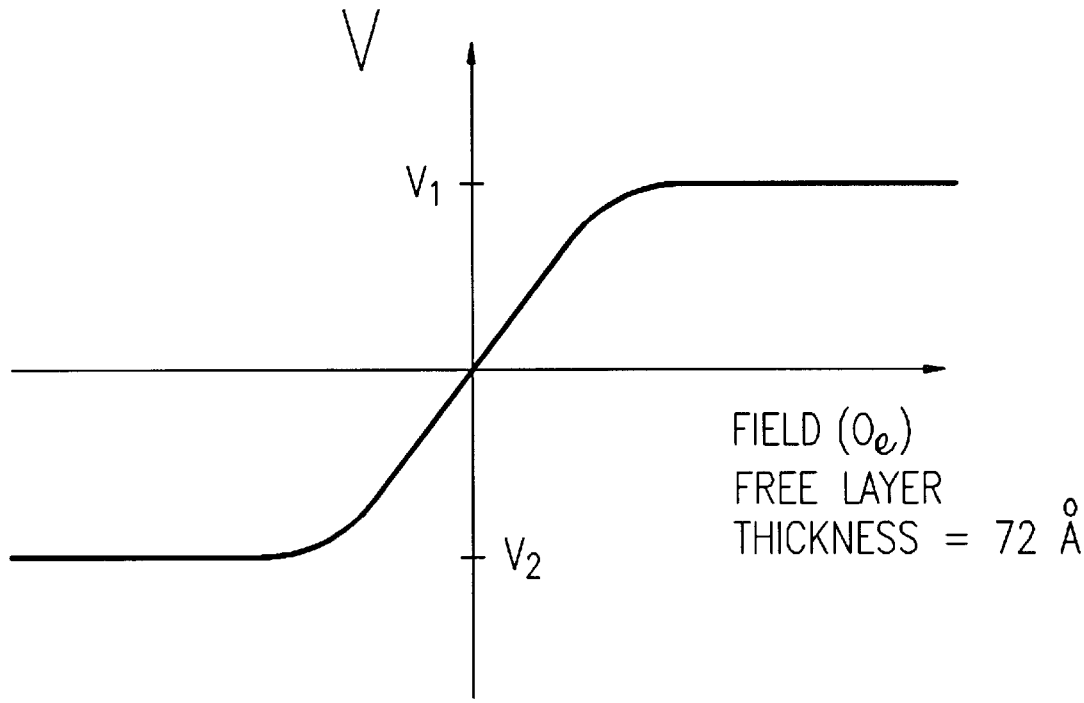
FIG. 2C is a transfer curve of the SV senor of FIG. 2A having a free layer thickness of 72 Å.
Figure 2D:
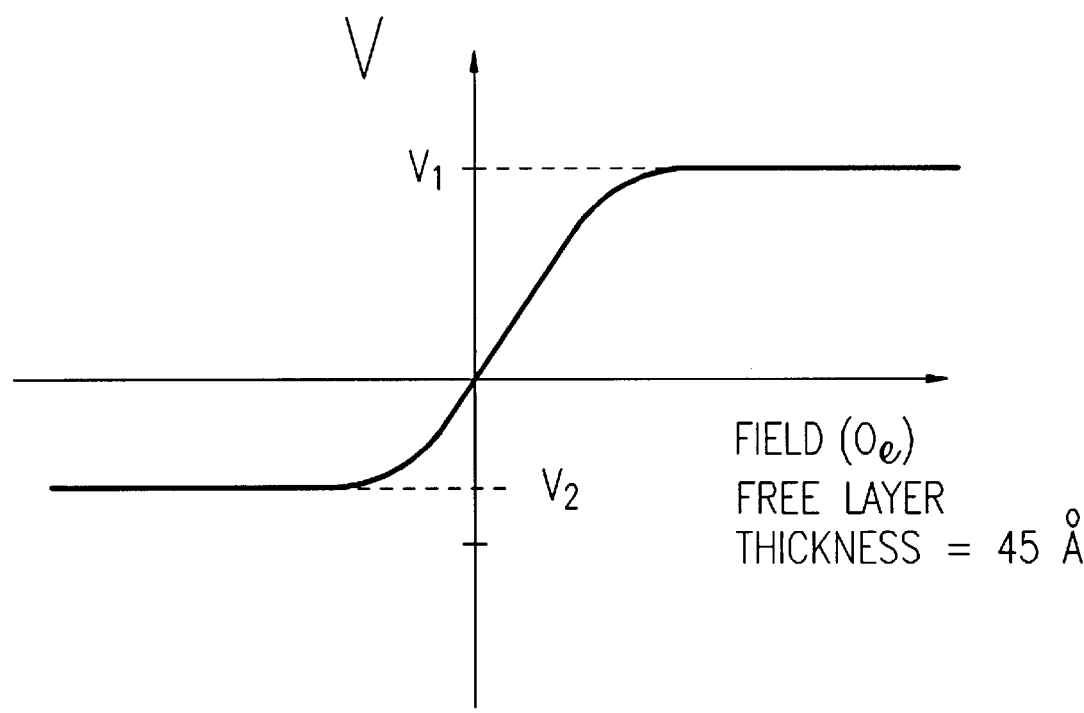
FIG. 2D is a transfer curve of the SV sensor of FIG. 2A having a free layer thickness of 45 Å.

FIG. 4c shows the transfer curve for the read back voltage signal as a function of the applied fields for the AP-pinned SV sensor 400 having free layer thickness of 45 Å while the thickness of all other common layers between the SV sensors 400 and 200 were kept the same. Comparing FIG. 4C and FIG. 2D makes it clear that SV sensor 400 of the present invention has a transfer curve which is far more symmetrical than the transfer curve of FIG. 2D which had about 30% asymmetry. Indeed, by proper balancing of the five fields present in the SV sensor of the present invention, the effect of signal asymmetry can be virtually eliminated.

While the present invention has been particularly shown and described with reference to the preferred embodiments, it will be understood by those skilled in the art that various changes in form and detail may be made without departing from the spirit, scope, and teaching of the invention. Accordingly, the disclosed invention is to be considered merely as illustrative and limited in scope only as specified in the appended claims.

I claim:

1. An anti-parallel (AP)-pinned spin valve (SV) sensor, comprising:
    a first spacer layer;
    a second spacer layer;
    a free layer of ferromagnetic material disposed between said first and second spacer layers;
    a pinned layer of ferromagnetic material, said second spacer layer being disposed between said pinned layer and said free layer;
    an AP-pinned layer separated from said free layer by said first spacer layer, said AP-pinned layer including:
        an anti-parallel coupling layer;
        first, second and third AP-pinned layers of ferromagnetic material, said first and second AP-pinned layers being separated from said third AP-pinned layer by said anti-parallel coupling layer, said third AP-pinned layer being disposed between said anti-parallel coupling layer and said first spacer layer, said first AP-pinned layer being made of a first ferromagnetic material, said second and third AP-pinned layers being made of a second ferromagnetic material distinct from said first ferromagnetic material; and
    antiferromagnetic (AFM) layer in contact with said first AP-pinned layer for pinning the magnetization direction of said first AP-pinned layer.

2. The AP-pinned SV as in claim 1 wherein said first ferromagnetic material is NiFe.

3. The AP-pinned SV sensor as in claim 1 wherein said second ferromagnetic material is cobalt.

4. The AP-pinned SV sensor as recited in claim 1 wherein said AFM layer is made of NiO.

5. The AP-pinned SV sensor as recited in claim 1 wherein said AFM layer is made of NiMn.

6. The AP-pinned SV sensor as recited in claim 1 wherein said first spacer layer material is selected from a group of material consisting of copper, gold and silver.

7. The AP-pinned SV sensor as recited in claim 1 wherein said second spacer layer material is selected from a group of material consisting of tantalum, alumina, copper, gold and silver.

8. The AP-pinned SV sensor as recited in claim 1 wherein said first spacer layer is made of copper and said second spacer layer is made of copper.

9. The AP-pinned SV sensor as recited in claim 1 wherein said first spacer layer is made of copper and said second spacer layer is made of tantalum.

10. The AP-pinned SV sensor as recited in claim 1 wherein said anti-parallel coupling layer is selected from a group of material consisting of ruthenium, iridium and rhodium.

11. The AP-pinned SV sensor as recited in claim 1 wherein said pinned layer material is selected from the group of material consisting of Ni—Fe and Co.

12. The AP-pinned SV sensor as in claim 1 wherein said free layer further comprises first and second free layers.

13. The AP-pinned SV sensor as in claim 12 wherein said first free layer is in contact with said first spacer layer and said second free layer is in contact with said second spacer layer, said first free layer being made of cobalt and said second free layer being made of Ni—Fe.

14. A disk drive system, comprising:
    a magnetic recording disk;
    an anti-parallel (AP)-pinned spin valve (SV) sensor, comprising:
        a first spacer layer;
        a second spacer layer;
        a free layer of ferromagnetic material disposed between said first and second spacer layers;
        a pinned layer of ferromagnetic material, said second spacer layer being disposed between said pinned layer and said free layer;
        an AP-pinned layer separated from said free layer by said first spacer layer, said AP-pinned layer including:
            an anti-parallel coupling layer;
            first, second and third AP-pinned layers of ferromagnetic material, said first and second AP-pinned layers being separated from said third AP-pinned layer by said anti-parallel coupling layer, said third AP-pinned layer being disposed between said anti-parallel coupling layer and said first spacer layer, said first AP-pinned layer being made of a first ferromagnetic material, said second and third AP-pinned layers being made of a second ferromagnetic material distinct from said first ferromagnetic material; and antiferromagnetic (AFM) layer in contact with said first AP-pinned layer for pinning the magnetization direction of said first AP-pinned layer;

an actuator for moving said spin valve sensor across the magnetic recording disk so the spin valve sensor may access different regions of magnetically recorded data on the magnetic recording disk; and means electrically coupled to the spin valve sensor for detecting changes in resistance of the sensor caused by rotation of the magnetization axis of the free ferromagnetic layer relative to the fixed magnetizations of the AP-pinned layer in response to magnetic fields from the magnetically recorded data.

15. The disk drive system of claim 14 wherein said first ferromagnetic material is NiFe.

16. The disk drive system of claim 14 wherein said second ferromagnetic material is cobalt.

17. The disk drive system of claim 14 wherein said AFM layer is made of NiO.

18. The disk drive system of claim 14 wherein said AFM layer is made of NiMn.

19. The disk drive system of claim 14 wherein said first spacer layer material is selected from a group of material consisting of copper, gold and silver.

20. The disk drive system of claim 14 wherein said second spacer layer material is selected from a group of material consisting of tantalum, alumina, copper, gold and silver.

21. The disk drive system of claim 14 wherein said first spacer layer material is copper and said second spacer layer material is copper.

22. The disk drive system of claim 14 wherein said first spacer layer material is copper and said second spacer layer material is tantalum.

23. The disk drive system of claim 14 wherein said anti-parallel coupling layer is selected from a group of material consisting of ruthenium, iridium and rhodium.

24. The disk drive system of claim 14 wherein said pinned layer material is selected from the group of material consisting of Ni—Fe and Co.

25. The disk drive system of claim 14 wherein said free layer further comprises first and second free layers.

26. The disk drive system of claim 25 wherein said first free layer is in contact with said first spacer layer and said second free layer is in contact with said second spacer layer, said first free layer being made of cobalt and said second free layer being made of Ni—Fe.

27. An anti-parallel (AP)-pinned spin valve (SV) sensor, comprising:

a first spacer layer of electrically conducting material;
a second spacer layer of electrically conducting material;
a free layer of ferromagnetic material disposed between and in contact with said first and second spacer layers;
a pinned layer of ferromagnetic material, said second spacer layer being disposed between and in contact with said pinned layer and said free layer;
an AP-pinned layer separated from said free layer by said first spacer layer, said AP-pinned layer including:

an anti-parallel coupling layer;
first, second and third AP-pinned layers of ferromagnetic material, said first and second AP-pinned layers being separated from said third AP-pinned layer by said anti-parallel coupling layer, said third AP-pinned layer being disposed between and in contact with said anti-parallel coupling layer and said first spacer layer, said first AP-pinned layer being made of a first ferromagnetic material, said second and third AP-pinned layers being made of a second ferromagnetic material distinct from said first ferromagnetic material; and antiferromagnetic (AFM) layer in contact with said first AP-pinned layer for pinning the magnetization direction of said first AP-pinned layer.

28. The AP-pinned SV as in claim 27 wherein said first ferromagnetic material is NiFe.

29. The AP-pinned SV sensor as in claim 27 wherein said second ferromagnetic material is cobalt.

30. The AP-pinned SV sensor as recited in claim 27 wherein said AFM layer material is NiO.

31. The AP-pinned SV sensor as recited in claim 27 wherein said AFM layer material is NiMn.

32. The AP-pinned SV sensor as recited in claim 27 wherein said first spacer layer material is selected from a group of material consisting of copper, gold and silver.

33. The AP-pinned SV sensor as recited in claim 27 wherein said second spacer layer material is selected from a group of material consisting of copper, gold and silver.

34. The AP-pinned SV sensor as recited in claim 27 wherein said anti-parallel coupling layer is selected from a group of material consisting of ruthenium, iridium and rhodium.

35. The AP-pinned SV sensor as recited in claim 27 wherein said pinned layer material is selected from the group of material consisting of Ni—Fe and Co.

36. The AP-pinned SV sensor as in claim 27 wherein said free layer further comprises first and second free layers.

37. The AP-pinned SV sensor as in claim 36 wherein said first free layer is in contact with said first spacer layer and said second free layer is in contact with said second spacer layer, said first free layer being made of cobalt and said second free layer being made of Ni—Fe.

38. A disk drive system, comprising:

a magnetic recording disk;
an anti-parallel (AP)-pinned spin valve (SV) sensor, comprising:

a first spacer layer of electrically conducting material;
a second spacer layer of electrically conducting material;
a free layer of ferromagnetic material disposed between and in contact with said first and second spacer layers;
a pinned layer of ferromagnetic material, said second spacer layer being disposed between and in contact with said pinned layer and said free layer;
an AP-pinned layer separated from said free layer by said first spacer layer, said AP-pinned layer including:

an anti-parallel coupling layer;
first, second and third AP-pinned layers of ferromagnetic material, said first and second AP-pinned layers being separated from said third AP-pinned layer by said anti-parallel coupling layer, said third AP-pinned layer being disposed between and in contact with said anti-parallel coupling layer and said first spacer layer, said first AP-pinned layer being made of a first ferromagnetic material, said second and third AP-pinned layers being made of a second ferromagnetic material distinct from said first ferromagnetic material; and antiferromagnetic (AFM) layer in contact with said first AP-pinned layer for pinning the magnetization direction of said first AP-pinned layer;

an actuator for moving said AP-pinned SV sensor across the magnetic recording disk so the SV may access different regions of magnetically recorded data on the magnetic recording disk; and means electrically coupled to the SV sensor for detecting changes in resistance of the SV sensor caused by rotation of the magnetization axis of the free ferromagnetic layer relative to the fixed magnetizations of the AP-pinned layer in response to magnetic fields from the magnetically recorded data.

39. The disk drive system as in claim 38 wherein said second ferromagnetic material is cobalt.

40. The-disk drive system as recited in claim 38 wherein said AFM layer material is NiO.

41. The disk drive system as recited in claim 38 wherein said AFM layer material is NiMn.

42. The disk drive system as recited in claim 38 wherein said first spacer layer material is selected from a group of material consisting of copper, gold and silver.

43. The disk drive system as recited in claim 38 wherein said second spacer layer material is selected from a group of material consisting of copper, gold and silver.

44. The disk drive system as recited in claim 38 wherein said anti-parallel coupling layer is selected from a group of material consisting of ruthenium, iridium and rhodium.

45. The disk drive system as recited in claim 38 wherein said pinned layer material is selected from the group of material consisting of Ni—Fe and Co.

46. The disk drive system as in claim 38 wherein said free layer further comprises first and second free layers.

47. The disk drive system as in claim 46 wherein said first free layer is in contact with said first spacer layer and said second free layer is in contact with said second spacer layer, said first free layer being made of cobalt and said second free layer being made of Ni—Fe.

* * * * *